United States Patent
Yin et al.

(10) Patent No.: US 11,079,884 B2
(45) Date of Patent: Aug. 3, 2021

(54) TOUCH DISPLAY PANEL, OPERATING METHOD THEREOF AND TOUCH DISPLAY DEVICE

(71) Applicant: Shanghai AVIC OPTO Electronics Co., Ltd., Shanghai (CN)

(72) Inventors: Guihua Yin, Shenzhen (CN); Songlin Feng, Shenzhen (CN); Huanhua Zhi, Shenzhen (CN); Huihui Xie, Shenzhen (CN); Qingpeng Liao, Shenzhen (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/702,992

(22) Filed: Dec. 4, 2019

(65) Prior Publication Data

US 2021/0064162 A1 Mar. 4, 2021

(30) Foreign Application Priority Data

Aug. 30, 2019 (CN) .......................... 201910811384.8

(51) Int. Cl.
| | | |
|---|---|---|
| *G06F 3/044* | (2006.01) | |
| *G06F 3/041* | (2006.01) | |
| *H01L 27/12* | (2006.01) | |
| *G02F 1/1333* | (2006.01) | |
| *G02F 1/1345* | (2006.01) | |
| *G02F 1/1362* | (2006.01) | |
| *G02F 1/1368* | (2006.01) | |
| *H01L 27/32* | (2006.01) | |

(52) U.S. Cl.
CPC ............ *G06F 3/044* (2013.01); *H01L 27/124* (2013.01); *G02F 1/1368* (2013.01); *G02F 1/13338* (2013.01); *G02F 1/13452* (2013.01); *G02F 1/136286* (2013.01); *G06F 2203/04108* (2013.01); *H01L 27/323* (2013.01); *H01L 27/3276* (2013.01)

(58) Field of Classification Search
CPC ............................ G06F 3/044; G06F 3/04164
See application file for complete search history.

(56) References Cited

U.S. PATENT DOCUMENTS

| | | | | |
|---|---|---|---|---|
| 2014/0084992 A1* | 3/2014 | Chen | ..................... | G06F 3/0448 |
| | | | | 327/517 |
| 2016/0293077 A1* | 10/2016 | Ma | ......................... | G09G 3/006 |

(Continued)

FOREIGN PATENT DOCUMENTS

CN 106775055 A 5/2017

*Primary Examiner* — William Boddie
*Assistant Examiner* — Andrew B Schnirel
(74) *Attorney, Agent, or Firm* — Anova Law Group, PLLC

(57) ABSTRACT

Touch display panel, operating method, and a touch display device are provided. The touch display panel includes a base substrate, a plurality of electrode blocks arranged in an array on the base substrate, a first driving unit including a plurality of first pins, a plurality of switch transistors, and a second driving unit including at least a plurality of first sub-pins and a plurality of second sub-pins. Each electrode block is electrically connected to the first driving unit through at least one touch signal line; a drain of at least one first switch transistor is electrically connected to the same first sub-pin through a same first lead; and a drain of at least one second switch transistor is electrically connected to the same second sub-pin through a same second lead.

15 Claims, 9 Drawing Sheets

(56) References Cited

U.S. PATENT DOCUMENTS

| | | | | |
|---|---|---|---|---|
| 2016/0328073 A1* | 11/2016 | Lai | ................... | G06F 3/04166 |
| 2017/0046003 A1* | 2/2017 | Huang | ................ | G06F 3/0443 |
| 2017/0185179 A1* | 6/2017 | Shao | ................... | G06F 3/041 |
| 2017/0220153 A1* | 8/2017 | Koide | ................ | G06F 3/0412 |
| 2017/0262112 A1* | 9/2017 | Noguchi | ............. | G06F 3/0414 |
| 2018/0348950 A1* | 12/2018 | Nakanishi | ............ | G06F 3/0445 |
| 2019/0012013 A1* | 1/2019 | Teranishi | .......... | G06F 3/041662 |

\* cited by examiner

TOUCH DISPLAY PANEL, OPERATING METHOD THEREOF AND TOUCH DISPLAY DEVICE

RELATED APPLICATIONS

This application claims priority to Chinese Patent Application No. 201910811384.8, filed on Aug. 30, 2019, the content of which is incorporated by reference in its entirety.

FIELD OF THE TECHNOLOGY

The present disclosure relates to the field of display technologies and, more particularly, to a touch display panel, an operating method of the touch display panel, and a touch display device.

BACKGROUND

A flat panel display device is thin, energy-saving, radiation-free, and has been widely used. Existing flat display device includes a liquid crystal display (LCD) and an organic light emitting display (OLED).

A touch device has become a main human-computer interaction means for personal mobile communication devices and integrated information terminals such as tablet computers, smart phones, and super laptops due to its advantages of ease of operation, intuitiveness, and flexibility. According to different touch principles, the touch device can be divided into four main types: a resistive touch device, a capacitive touch device, an infrared touch device, and a surface wave touch device. With rapid development, various new touch technologies are more and more widely used in the display device. In a touch operation, a user can control applications executed by the display device by touching a touch surface and moving a finger on the touch surface. However, in some cases, the user has to touch the touch surface to perform some operations, which can cause inconvenience. Therefore, for the touch screen, development of the touch action function on the screen has been gradually developed, and other non-touch actions and effective input methods have yet to be developed. Floating touch is an emerging touch technology, which can complete the human-computer interaction without touching the touch surface. Simply speaking, by using the floating touch technology, even when a touch body (such as a user's finger) does not contact with the touch screen of an electronic device, the floating touch can also realize the operations of touch functions such as clicking, sliding and so on, and the floating touch is a more convenient human-computer interaction mode.

The floating touch is generally performed by manners of capacitive sensitive touch and external infrared sensor. As to the manner of external infrared sensor, an infrared sensor is provided on an outer side of the touch display apparatus, and its principle for realizing the floating touch is that: the infrared sensor emits infrared light at the time of the touch display apparatus displaying an image, the infrared light is reflected by the finger in the case that there is a certain distance between the finger and the screen and is received by the infrared sensor, and a position and a specific action of the finger are determined accordingly. The external infrared sensor may cause the floating touch display apparatus to be bulky, and a number of the external infrared sensors is often insufficient (to avoid affecting normal display) so that the touch accuracy thereof is limited. As to the manner of capacitive sensitive touch, a sensing capacitor identifies the touch action in the case that the finger is not in contact with the screen by increasing a sensitivity of the sensing capacitor, so as to realize the floating touch. But, in the case that the floating touch is performed by this manner, it is required that the distance between the finger and the screen should be short, so that the floating touch capability thereof is limited.

The above technical problems need to be solved by those skilled in the art. The disclosed touch display panel, operating method thereof and the touch display device is directed to solve one or more problems in the art. The touch display panel, the operating method thereof and the touch display device provided by the present disclosure can integrate a planar touch function, a floating touch function, and a display function, which can save cost and have high integration. The touch display panel, the operating method thereof and the touch display device provided by the present disclosure can also facilitate the realization of a narrow frame and improve a touch sensing signal amount and touch accuracy.

SUMMARY

One aspect of the present disclosure provides a touch display panel. The touch display panel includes a base substrate. The base substrate includes a plurality of electrode blocks arranged in an array on the base substrate, a first driving unit including a plurality of first pins, a plurality of switch transistors, and a second driving unit including at least a plurality of first sub-pins and a plurality of second sub-pins. Each electrode block is electrically connected to the first driving unit through at least one touch signal line. One end of each touch signal line is electrically connected to one electrode block, and the other end of each touch signal line is electrically connected to the first pin in one-to-one correspondence. A source of each switch transistor is electrically connected to the first pin in one-to-one correspondence, and a drain of each switch transistor is electrically connected to the first sub-pin and the second sub-pin in one-to-one correspondence. A gate of each switch transistor is electrically connected to a same control signal line, and the control signal line is electrically connected to the second driving unit. The plurality of electrode blocks arranged in the array include at least one electrode block group, where each electrode block group includes a plurality of first electrode blocks and a plurality of second electrode blocks disposed around the plurality of first electrode blocks. The plurality of switch transistors include a plurality of first switch transistors and a plurality of second switch transistors, where the switch transistor electrically connected to the first electrode block is the first switch transistor, and the switch transistor electrically connected to the second electrode block is the second switch transistor. A drain of at least one first switch transistor is electrically connected to the same first sub-pin through a same first lead. A drain of at least one second switch transistor is electrically connected to the same second sub-pin through a same second lead.

Another aspect of the present disclosure provides an operating method of the touch display panel. The touch display panel includes the above touch display panel. The method includes a first touch phase and a second touch phase. In the first touch phase, a switch transistor is in an off state, where a first driving unit applies a driving signal to each electrode block through a touch signal line; and when a touch occurs, the first driving unit determines a position where the touch occurs by receiving difference of sensing signals outputted by each electrode block. In the second touch phase, the switch transistor is in an on state, where the first driving unit stops applying the driving signal to each electrode block; the second driving unit applies the driving signal to each first electrode block through a first sub-pin; the second driving unit applies the sensing signal to each second electrode block through a second sub-pin; an electric field is formed between the first electrode block and the second electrode block; when a touch distance is less than or equal to a first distance, the touch occurs; the electric field between the first electrode block and the second electrode block changes; and the second driving unit detects a change amount of capacitance value between the first electrode block and the second electrode block to determine the position where the touch occurs, where the touch distance refers to a vertical distance between a touch body and the touch display panel.

Another aspect of the present disclosure provides a touch display device. The device includes the above touch display panel.

Other aspects of the present disclosure can be understood by those skilled in the art in light of the description, the claims, and the drawings of the present disclosure.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure, and those skilled in the art can obtain other drawings based on these drawings without inventive efforts.

Reference will now be made in detail to exemplary embodiments of the disclosure, which are illustrated in the accompanying drawings. Wherever possible, the same reference numbers will be used throughout the drawings to refer to the same or like parts.

DESCRIPTION OF EMBODIMENTS

To make clearer of the objectives, technical solutions, and advantages of the present disclosure, the followings further describe the present disclosure in detail with reference to the accompanying drawings. Obviously, the described embodiments are only some but not all of the embodiments of the present disclosure. All other embodiments obtained by a person of ordinary skill in the art based on the disclosed embodiments of the present disclosure without creative efforts are within the scope of the present disclosure.

It is to be noted that similar reference signs and letters represent similar items in the following drawings and thus, once a certain item is defined in a drawing, it is not required to be further defined and explained in the following drawings. In addition, terms "first", "second", "third" and the like are only adopted for distinctive description and should not be understood to indicate or imply relative importance.

The present disclosure provides a touch display panel, an operating method thereof and a touch display device.

Figure 1:
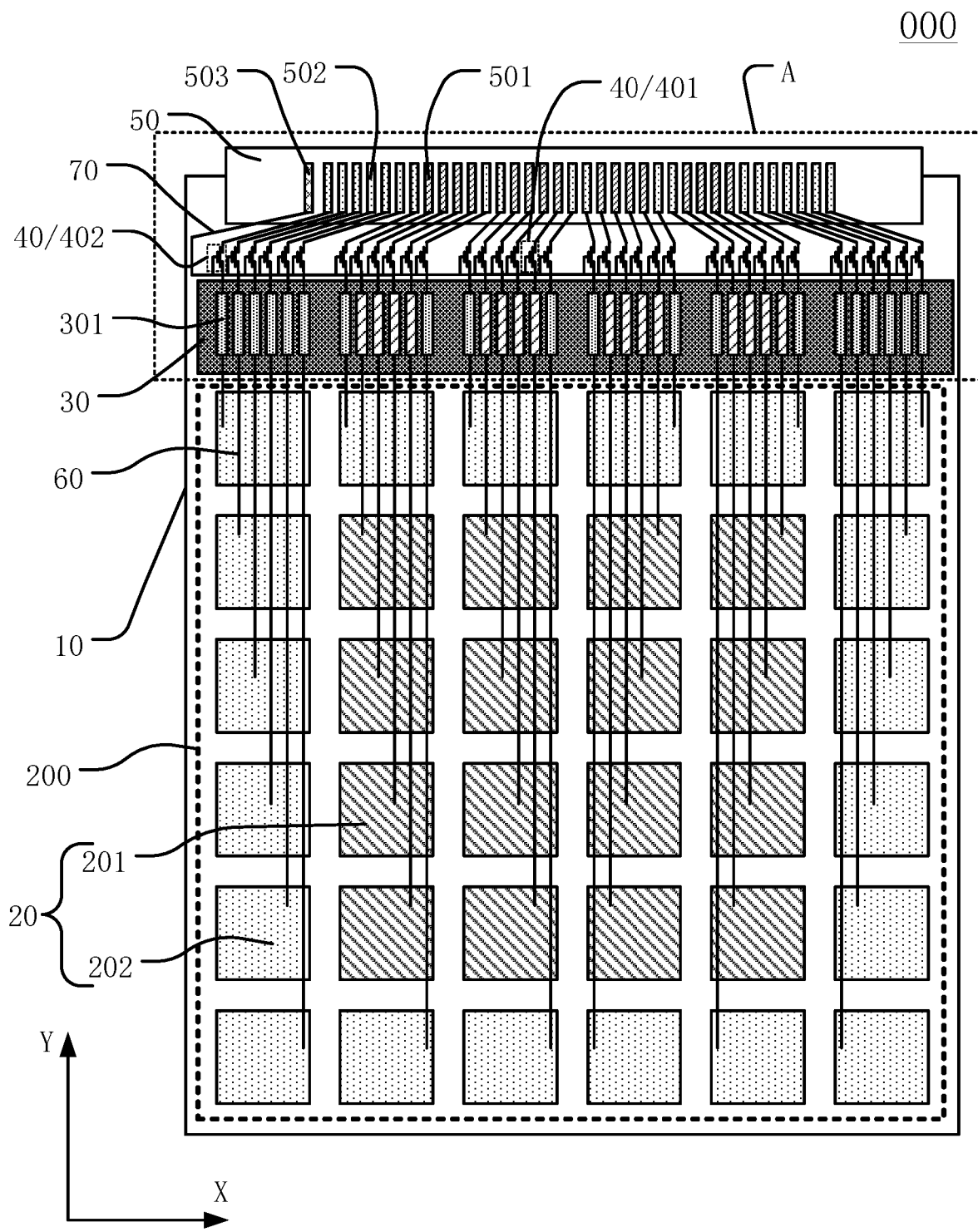
FIG. 1 illustrates a plan view of a touch display panel according to an embodiment of the present disclosure.
Figure 2:
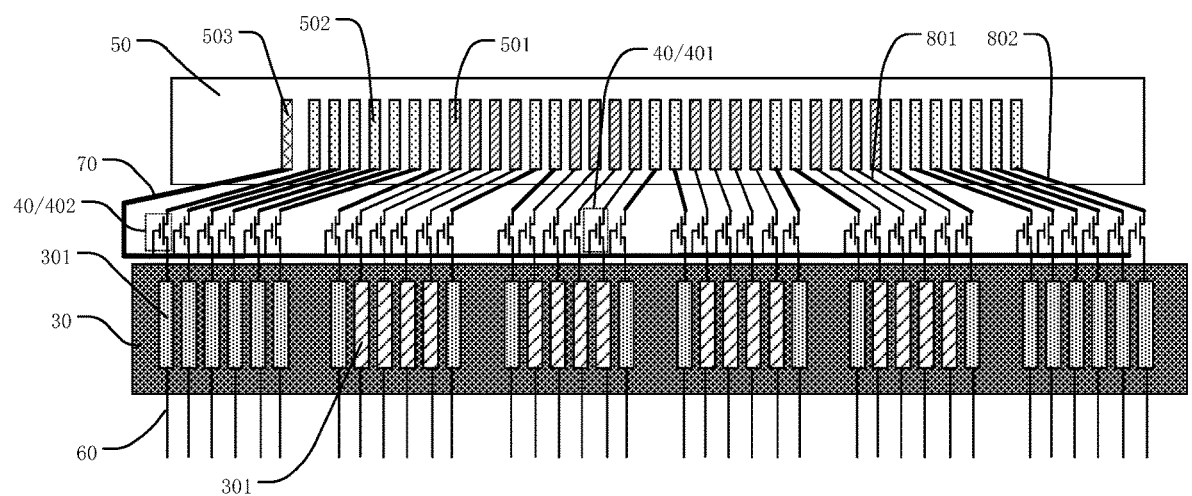
FIG. 2 illustrates a partial, enlarged perspective view of region A in FIG. 1.

FIG. 1 illustrates a plan view of a touch display panel according to an embodiment of the present disclosure (in FIG. 1, the number of electrode blocks and the number of pins on a driving unit are only examples and can be set based on actual situations), and FIG. 2 illustrates a partial, enlarged perspective view of region A in FIG. 1. In one embodiment, the touch display panel 000 includes a base substrate 10 (for clarity of illustration purposes, the base substrate 10 is unfilled in FIG. 1 and FIG. 2), a plurality of electrode blocks 20 arranged in an array on the base substrate 10, a first driving unit 30, a plurality of switch transistors 40, and a second driving unit 50 (for clarity of illustration purposes, the second driving unit 50 is unfilled in FIG. 1 and FIG. 2).

The first driving unit 30 includes a plurality of first pins 301. The second driving unit 50 includes at least a plurality of first sub-pins 501 and a plurality of second sub-pins 502. Each electrode block 20 is electrically connected to the first driving unit 30 through at least one touch signal line 60. One end of each touch signal line 60 is electrically connected to one electrode block 20, and the other end of each touch signal line 60 is electrically connected to the first pin 301 in one-to-one correspondence.

A source (not labeled in FIG. 1 and FIG. 2) of each switch transistor 40 is electrically connected to the first pin 301 in one-to-one correspondence. A drain (not labeled in FIG. 1 and FIG. 2) of each switch transistor 40 is electrically connected to the first sub-pin 501 and the second sub-pin 502 in one-to-one correspondence.

A gate (not labeled in FIG. 1 and FIG. 2) of each switch transistor 40 is electrically connected to a same control signal line 70. The control signal line 70 is electrically connected to the second driving unit 50.

The plurality of electrode blocks 20 arranged in the array include at least one electrode block group 200, where each electrode block group 200 includes a plurality of first electrode blocks 201 and a plurality of second electrode blocks 202 disposed around the plurality of first electrode blocks 201.

The plurality of switch transistors 40 include a plurality of first switch transistors 401 and a plurality of second switch transistors 402. The switch transistor 40 electrically connected to the first electrode block 201 is the first switch transistor 401. The switch transistor 40 electrically connected to the second electrode block 202 is the second switch transistor 402.

A drain of at least one first switch transistor 401 is electrically connected to the same first sub-pin 501 through a same first lead 801.

A drain of at least one second switch transistor 402 is electrically connected to the same second sub-pin 502 through a same second lead 802 (to illustrate technical solutions of the embodiment more clearly, the first lead 801 and the second lead 802 are represented by different thickness lines shown in FIG. 2, but in the actual production process, it does not mean that the first lead 801 and the second lead 802 are different in thickness, and the first lead 801 and the second lead 802 can be set according to actual needs).

In the prior art, some touch panels only have a floating touch function. For example, a large amount of driving electrodes are arranged in the middle of a touch panel, and sensing electrodes are arranged around the driving electrodes to realize a floating touch function, but no planar touch function and display function, and the function is single. Some touch panel can realize both the planar touch function and the floating touch function. However, when the floating touch function is performed, the floating electrodes need to be disposed on the periphery of the planar touch sensing electrodes. Therefore, a narrow frame cannot be realized, and the display function and the touch function cannot be integrated. There are also touch panels that can only perform the display function and the planar touch function. For example, for current embedded design products, the display function and the touch function can be realized through reusing the common electrode layer of a liquid crystal display in a time division manner, where the common electrode layer is used as the common electrode in the display phase, and the common electrode layer is used as the touch sensing electrode in the touch phase. However, the floating touch function cannot be realized.

In one embodiment, the touch display panel can integrate the planar touch function, the floating touch function, and the display function. For example, the base substrate 10 includes a plurality of electrode blocks 20 arranged in an array, a first driving unit 30, a plurality of switch transistors 40, and a second driving unit 50. The first driving unit 30 includes a plurality of first pins 301. Each electrode block 20 is electrically connected to the first driving unit 30 through at least one touch signal line 60. One end of each touch signal line 60 is electrically connected to one electrode block 20, and the other end of each touch signal line 60 is electrically connected to the first pin 301 in one-to-one correspondence. A gate of each switch transistor 40 is electrically connected to a control signal line 70, and the control signal line 70 is electrically connected to the second driving unit 50.

In the planar touch phase, all the switch transistors 40 controlled by the same control signal line 70 are turned off. Only the first driving unit 30 applies a touch signal to each electrode block 20 through the touch signal line 60 and receives the sense signal when the touch occurs, thus realizing the planar touch function. Alternatively, in one embodiment, in an array of electrode blocks 20 made by conductive material and arranged along the first direction X and the second direction Y, each electrode block 20 connects to the ground to form a capacitor. This capacitor is so-called self-capacitance, that is, a capacitance formed by connecting the electrode block 20 to the ground. When a touch body (for example, a finger) touches the panel surface, the capacitance of the finger is superimposed on the panel capacitance to increase the capacitance value of the panel. The first driving unit 30 may detect a change amount of capacitance value of the electrode block 20 disposed along the first direction X and the electrode block 20 disposed along the second direction Y before and after the touch, respectively. Thus, horizontal coordinates and vertical coordinates can be respectively determined and combined to form touch coordinates at which the planar touch occurs. When performing a multi-point touch operation, for example, a two-point touch operation, two horizontal coordinates and two vertical coordinates can be respectively obtained to form four position coordinates. Thus, in the planar touch phase, the first driving unit 30 determines the position where the touch occurs by receiving different sensing signal outputted from each electrode block 20, thereby realizing high touch sensitivity and performing the multi-touch operation.

The second driving unit 50 includes at least a plurality of first sub-pins 501 and a plurality of second sub-pins 502. The source of each switch transistor 40 is electrically connected to the first pin 301 in one-to-one correspondence, and the drain of each switch transistor 40 is electrically connected to the first sub-pin 501 and the second sub-pin 502 in one-to-one correspondence. The plurality of switch transistors 40 include a plurality of first switch transistors 401 and a plurality of second switch transistors 402. The switch transistor 40 electrically connected to the first electrode block 201 is the first switch transistor 401. The switch transistor 40 electrically connected to the second electrode block 202 is the second switch transistor 402.

In the floating touch phase, all of the switch transistors 40 controlled by the same control signal line 70 are turned on. Currently, the first driving unit 30 stops applying the driving signals to each electrode block 20, and only the second driving unit 50 applies a driving signal to each of the first electrode blocks 201 through the first sub-pin 501 and the first switch transistor 401. The first electrode block 201 is used as a driving electrode. The second driving unit 50 applies a sensing signal to each of the second electrode block 202 through the second sub-pin 502 and the second switch transistor 402, and the second electrode block 202 is used as a sensing electrode. When the touch distance (a vertical distance between the touch body and the touch display panel) is less than or equal to a preset first distance, the touch occurs. At this time, the electric field between the first electrode block 201 and the second electrode block 202 changes, and the second driving unit 50 determines the location where the floating touch occurs by detecting the change amount of capacitance value between the first electrode block 201 and the second electrode block 202, where the drain of the at least one first switch transistor 401 is electrically connected to the same first sub-pin 501 through a same first lead 801. The drain of the at least one second switch transistor 402 is electrically connected to the same second sub-pin 502 through a same second lead 802. That is, each first sub-pin 501 is electrically connected to the first switch transistor 401 through the first lead 801, and each second sub-pin 502 is electrically connected to the second switch transistor 402 through the second lead 802. Therefore, the signal of each electrode block 20 can be sensed by different sub-pins of the second driving unit 50, thereby avoiding interference among signals and improving touch accuracy.

Optionally, the first driving unit 30 can also be electrically connected to other signal lines (not shown in FIG. 1 and FIG. 2) required for realizing the display function, such as scan lines and data lines of the touch display panel 000, for applying the display driving signal in the display stage. At this time, all of the switch transistors 40 controlled by the same control signal line 70 are turned off. Each electrode block 20 is used as a common electrode of the touch display panel. The first driving unit 30 applies a common potential signal to each electrode block 20, realizing the display function of the touch display panel 000. It should be noted that, since the switch transistor 40 is disposed between the first driving unit 30 and the second driving unit 50, and the electrode block 20 is electrically connected to the switch transistor 40 through the touch signal line 60 and the first pin 301 of the first driving unit 30, in order to improve rationality of the film structure layout, the electrode block 20 needs to be disposed on the array substrate, so that when the electrode block 20 is operable (or multiplexed, or reused) as the common electrode of the touch display panel, the above embodiment is applicable to an in-plain switching (IPS) display panel, a fringe field switching (FFS) display panel, or other display panels with common electrodes located on the array substrate. It should be further noted that the driving voltage applied by the driving unit is very low in the floating touch phase (only about 3.3V is generally needed to perform the touch driving); the touch driving signal applied by the driving unit is generally a square wave signal; and the time to apply the driving voltage is relatively short. Therefore, even if the electrode block 20 is operable as the common electrode and is disposed on the array substrate at this time, the liquid crystal is not polarized, and the display effect of the liquid crystal display panel is not affected.

Figure 3:
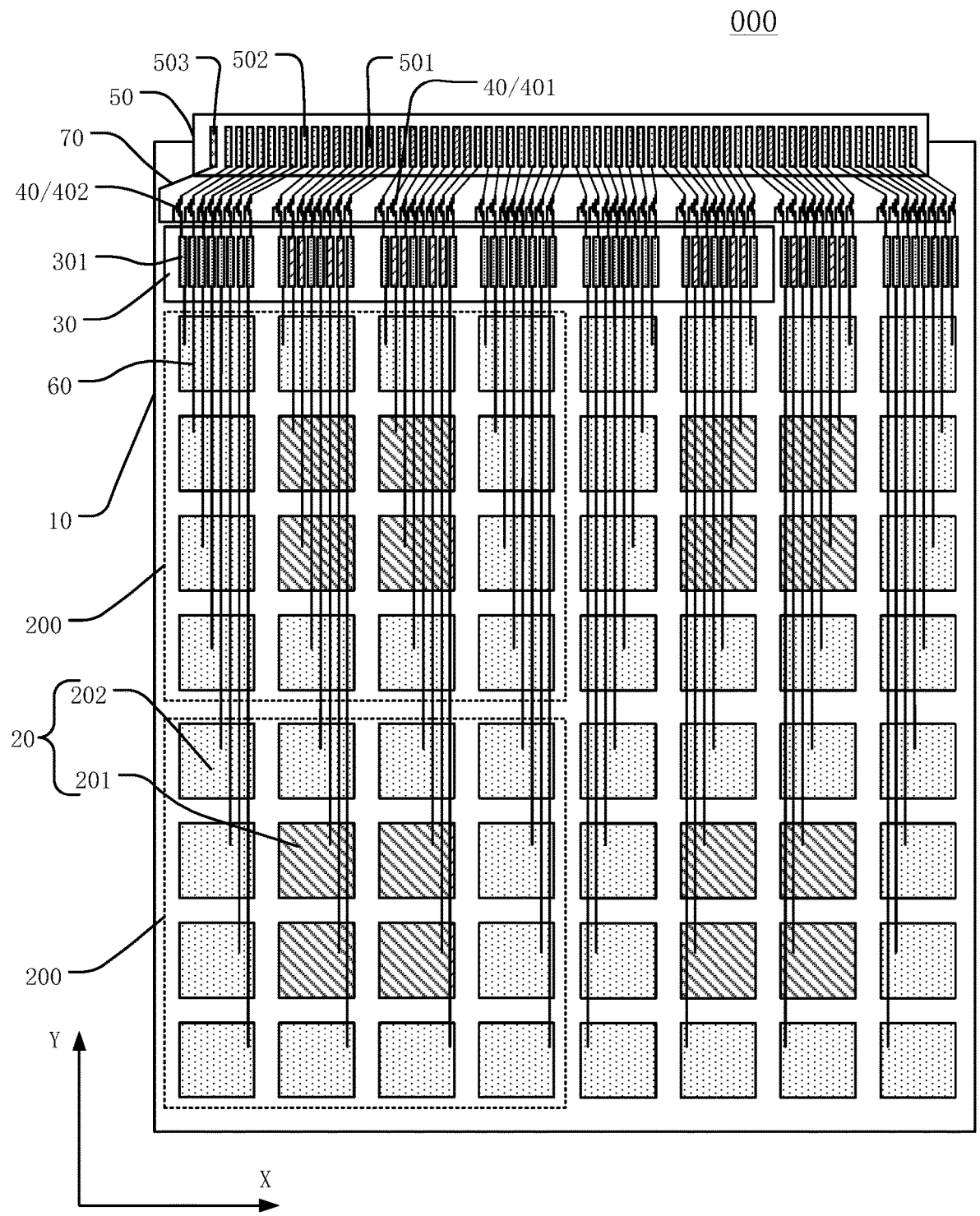
FIG. 3 illustrates a plan view of another touch display panel according to an embodiment of the present disclosure.

In one embodiment, the plurality of electrode blocks 20 arranged in the array include at least one electrode block group 200, where each electrode block group 200 includes a plurality of first electrode blocks 201 and a plurality of second electrode blocks 202 disposed around the plurality of first electrode blocks 201. That is, all the electrode blocks 20 on the touch display panel 000 can be divided into one electrode block group 200, as shown in FIG. 1. Optionally, all the electrode blocks on the touch display panel 000 can also be divided into a plurality of electrode block groups 200, as shown in FIG. 3. FIG. 3 illustrates a plan view of another touch display panel according to an embodiment of the present disclosure (for clarity of illustration purposes, in FIG. 3, both the first driving unit 30 and the second driving unit 50 are unfilled). The touch display panel 000 includes a plurality of electrode block groups 200, and each of the electrode block groups 200 includes a plurality of first electrode blocks 201 and a plurality of second electrode blocks 202 disposed around the plurality of first electrode blocks 201. When the touch occurs, a more accurate position is obtained through sensing amount of the sensing electrodes of the plurality of electrode block groups 200, thereby obtaining higher touch accuracy.

In one embodiment, the common electrode for performing the display function of the touch display panel 000 is operable as a sensing electrode for performing the planar touch function. The common electrode for performing the display function of the touch display panel 000 is also operable as the driving electrode and the sensing electrode for performing the floating touch function. The switch transistor 40 is disposed between the first driving unit 30 and the second driving unit 50. In conjunction with timing control, a switch operation among the planar touch function, the floating touch function and the display function can be realized through turning on or turning off the switch transistor 40. When the switch transistor 40 is turned off, the planar touch function and the display function can be performed. When the switch transistor 40 is turned on, the floating touch function can be performed. For example, the floating touch function and the planar touch function are performed in a time division manner, and the floating touch function and the planar touch function are switched by the timing and signal amount. When the vertical distance between the touch body and the touch display panel 000 is far, the planar touch signal is relatively weak. All the switch transistors 40 are turned on to enable the floating touch function. When the touch body is close to the surface of the touch display panel 000, the planar touch signal is enhanced. All the switch transistors 40 are turned off to disable the floating touch function and enable the planar touch function. Therefore, the integration of the planar touch function, the floating touch function and the display function is realized without the need to add additional peripheral sensing electrodes in the floating touch phase, facilitating the realization of the narrow frame. At the same time, the cost can be saved, and the touch sensing signal amount and touch accuracy can also be improved.

It should be note that, the switch transistor in the present embodiment may be a thin film transistor (TFT), a metal oxide semiconductor (MOS), or other transistors with a switching function, which are not repeated herein. Moreover, the switch transistor 40 may be a P-type switch transistor. In general, the P-type switch transistor are turned on when the gate has a low-level signal and turned off when the gate has a high-level signal. When the switch transistor 40 is a PMOS transistor, the source of the switch transistor 40 is electrically connected to the first driving unit 30, and the drain of the switch transistor 40 is electrically connected to the second driving unit 50. The switch transistor 40 may also be an N-type switch transistor. In general, the N-type switch transistor are turned on when the gate has the high-level signal and turned off when the gate has the low-level signal. When the switch transistor 40 is an NMOS transistor, the source of the switch transistor 40 is electrically connected to the second driving unit 50, and the drain of the switch transistor 40 is electrically connected to the first driving unit 30. The type of the switch transistor 40 is not limited. For example, the type of the switch transistor 40 can be set according to actual needs.

Figure 4:
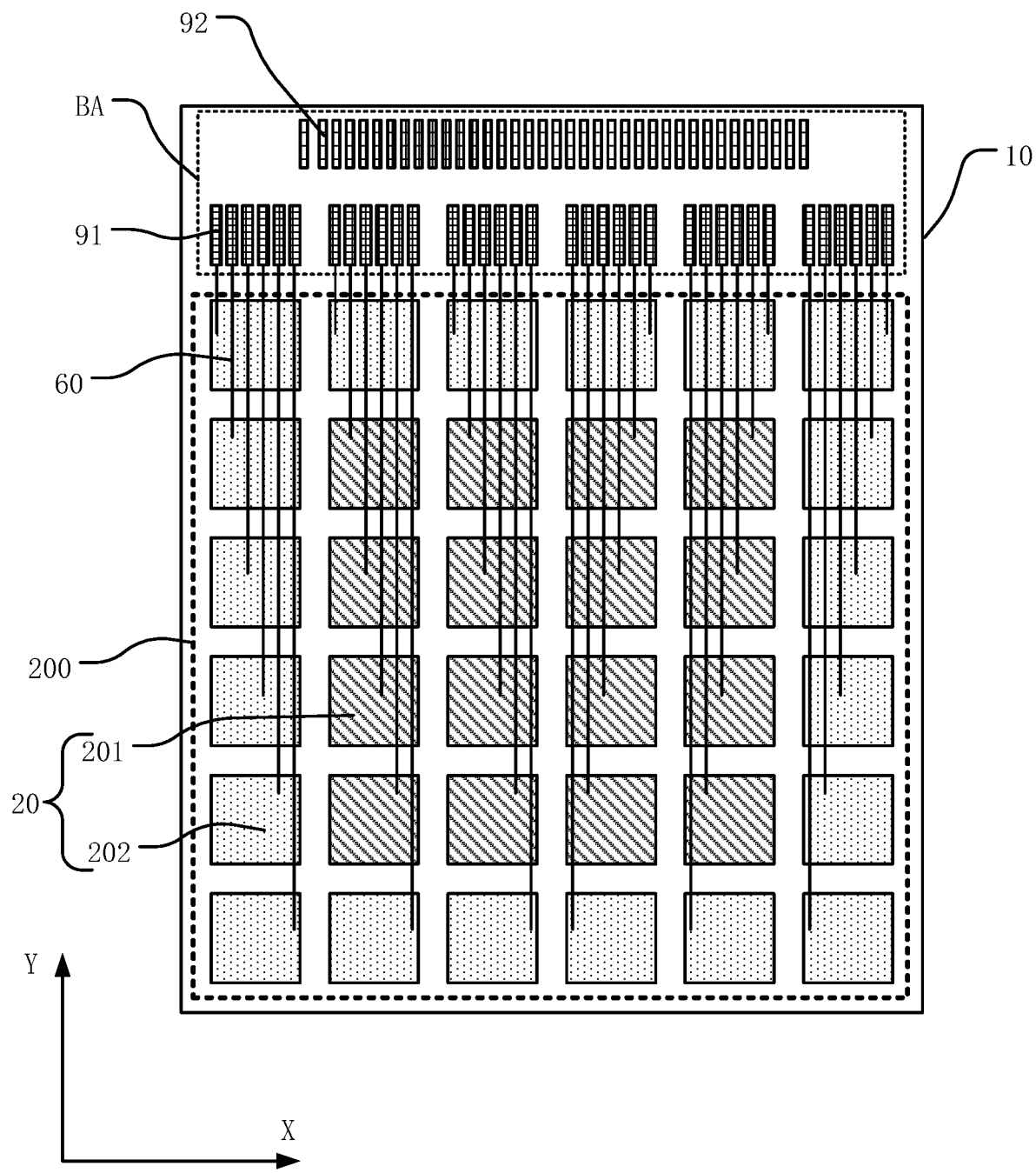
FIG. 4 illustrates a plan view of a base substrate according to an embodiment of the present disclosure.

In alternative embodiments, referring to FIG. 1, FIG. 2 and FIG. 4, FIG. 4 illustrates a plan view of a base substrate 10 in FIG. 1. The base substrate 10 includes a bonding area BA. The bonding area BA includes a plurality of first conductive pads 91 and a plurality of second conductive pads 92. The first pin 301 is electrically connected to the first conductive pad 91 in one-to-one correspondence. The first sub-pin 501 and the second sub-pin 502 are electrically connected to the second conductive pad 92 in one-to-one correspondence.

Further, the bonding area BA is disposed in the non-display area of the base substrate 10. The bonding area BA includes a plurality of first conductive pads 91 and a plurality of second conductive pads 92. The first pin 301 is electrically connected to the first conductive pad 91 in one-to-one correspondence. The first sub-pin 501 and the second sub-pin 502 are electrically connected to the second conductive pad 92 in one-to-one correspondence.

Optionally, each pad and pin may be fixed by a conductive adhesive. The first conductive pad 91 is used to electrically connect the first driving unit 30 and the base substrate 10, and the second conductive pad 92 is used to electrically connect the second driving unit 50 and the base substrate 10. Therefore, each pin on the first driving unit 30 and the second driving unit 50 is electrically connected to a signal line on the base substrate 10 to transmit an electric signal. Also, the first driving unit 30 and the second driving unit 50 do not occupy a range of the touch area and the display area of the touch display panel, making the layout more reasonable.

It should be noted that both the first driving unit 30 and the second driving unit 50 may be disposed on a driving circuit on the base substrate 10, and are integrated on the driver chip or the flexible printed circuit board (PCB) to achieve effect of electrically connecting the base substrate 10. The structure of the first driving unit 30 and the second driving unit 50 is not limited herein. The structure may be any other arrangement if the first driving unit 30 and the second driving unit 50 can apply driving and sensing signals for the electrode block 20 and other signal lines, which is not described herein.

In alternative embodiments, referring to FIG. 1, FIG. 2 and FIG. 3, the second driving unit 50 further includes at least one third sub-pin 503. The gate (a reference number in the FIGS. 1-3) of the switch transistor 40 is electrically connected to the third sub-pin 503 through the control signal line 70.

Further, the gates of all the switch transistors 40 are electrically connected to the same control signal line 70, and the second driving unit 50 applies the control signal for the control signal line 70. The second driving unit 50 only needs to set at least one third sub-pin 503. The second driving unit 50 is electrically connected to the gates of all of the switch transistors 40 through the third sub-pin 503 and the control signal line 70 to control the opening of the switch transistor 40. Since the floating touch function is turned on when the switch transistor 40 is turned on, the second driving unit 50 starts to apply the driving signal to the electrode block 20, and the first driving unit 30 stops applying the driving signal to each electrode block 20. Therefore, the control signal of the control signal line 70 is applied by the second driving unit 50, avoiding enabling the first driving unit 30 when the floating touch starts, or setting another driving unit to apply a control signal for the control signal line 70. Cost is saved, and the range of the panel frame occupied by the driving unit is reduced, which facilitates the realization of a narrow frame.

Figure 5:
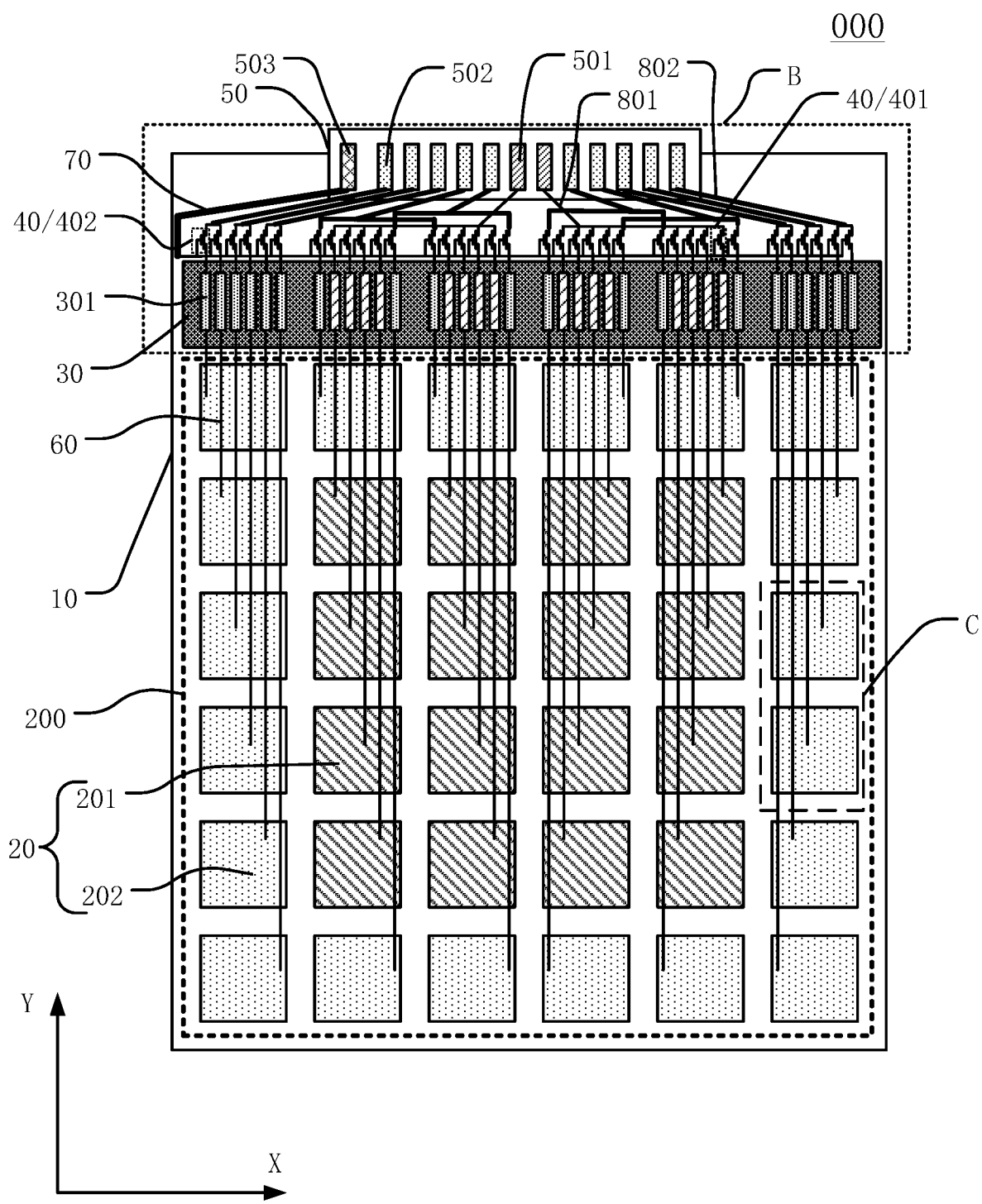
FIG. 5 illustrates a plan view of another touch display panel according to an embodiment of the present disclosure.
Figure 6:
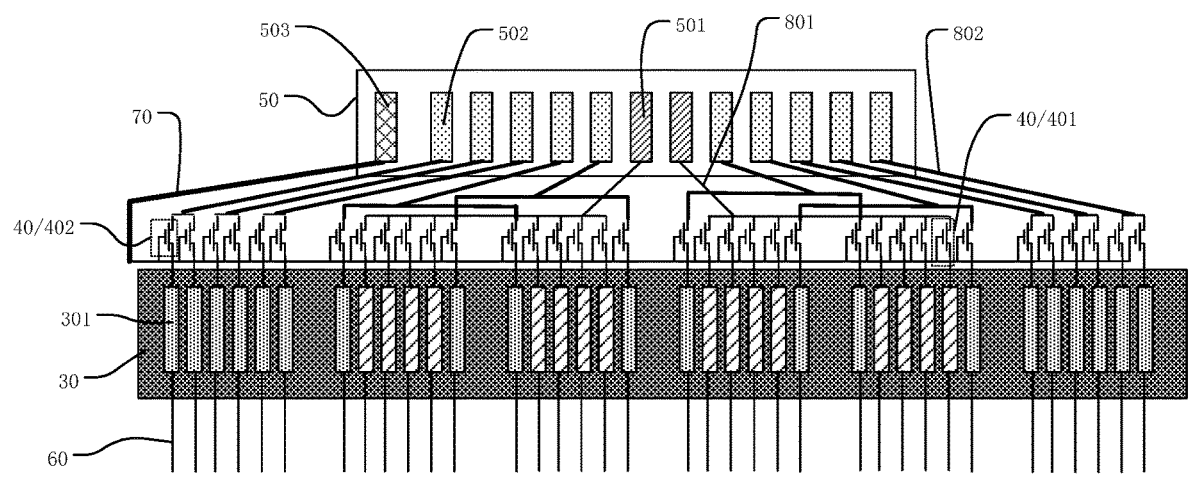
FIG. 6 illustrates a partial, enlarged perspective view of region B in FIG. 5.

In alternative embodiments, FIG. 5 illustrates a plan view of another touch display panel according to an embodiment of the present disclosure (In FIG. 5, the number of electrode blocks and the number of pins on a driving unit are only examples and can be set based on actual situations), and FIG. 6 illustrates a partial, enlarged perspective view of region B in FIG. 5. In one embodiment, the drains of at least two first switch transistors 401 are electrically connected to the same first sub-pin 501 through the same first lead 801; the drains of at least two second switch transistors 402 are electrically connected to the same second sub-pin 502 through the same second lead 802 (to illustrate technical solutions of the embodiment more clearly, the first lead 801 and the second lead 802 are represented by lines with different thickness shown in FIG. 5 and FIG. 6, but in the actual production process, it does not mean that the first lead 801 and the second lead 802 are different in thickness. The first lead 801 and the second lead 802 can be set according to actual needs).

Further, in order to improve the sensitivity of the floating touch while ensuring a large signal amount, since the electrical signals of at least two of the electrode blocks 20 are concentrated after each electrode block 20 passes through the switch transistor 40, a large touch point (the broken line frame C area as shown in FIG. 5) can be formed. That is, the drains of the at least two first switch transistors 401 are electrically connected to the same first sub-pin 501 through the same first lead 801, and the same first sub-pin 501 applies the driving signal to at least two first electrode blocks 201. The drains of at least two second switch transistors 402 are electrically connected to the same second sub-pin 502 through the same second lead 802, and the same second sub-pin 502 applies sensing signals to at least two second electrode blocks 202. When a touch distance (a vertical distance between the touch body and the touch display panel) is less than or equal to a preset first distance, the touch occurs. The second driving unit 50 can detect a change in an electric field between any one electrode block of the at least two first electrode blocks 201 and any one electrode block of the at least two second electrode blocks 202. The second driving unit 50 can also detect the change amount of capacitance value between the first electrode block 201 and the second electrode block 202 to determine the position at which the floating touch occurs.

In one embodiment, the touch signal amount can be increased, and the touch accuracy can be ensured. At least two first electrode blocks 201 are applied the signal through the same first sub-pin 501, and at least two second electrode blocks 202 are applied the signal through the same second sub-pin 502. Thus, the number of pins disposed on the second driving unit 50 can be greatly reduced, thereby reducing the area occupied by the second driving unit 50 and facilitating the realization of the narrow frame of the panel.

In alternative embodiments, returning to FIG. 5 and FIG. 6, in the same direction, the third sub-pin 503 is located at one end of the second driving unit 50, and the plurality of second sub-pins 502 include two portions that are respectively located at opposite ends of the plurality of first sub-pins 501.

Further, in order to further reasonably arrange the leads on the panel and avoid the short circuit caused by mutual interference, the third sub-pin 503 is located at one end of the second driving unit 50. In the same direction, for example, along the first direction X in FIG. 5 and FIG. 6, the third sub-pin 503 is located at the left end of the second driving unit 50. Alternatively, the third sub-pin 503 may also be located at the right end of the second driving unit 50. Therefore, the control signal line 70 connecting the gates of all the switch transistors 40 can be connected from both ends to the third sub-pin 503, so as to avoid the short circuit caused by the control signal line 70 crossing with other signal lines. Because the drains of the at least two first switch transistors 401 are electrically connected to the same first sub-pin 501 through the same first lead 801, and the drains of the at least two second switch transistors 402 are electrically connected to the same second sub-pin 502 through the same second lead 802, the plurality of first sub-pins 501 can be disposed in the center, and the plurality of second sub-pins 502 which are divided into left and right parts are respectively located at two sides of the first sub-pins 501. Thus, the first leads 801 can be concentrated on the center of the second driving unit 50 to be connected to the first sub-pin 501, and the second leads 802 are respectively concentrated on both sides of the second driving unit 50 to be connected to the second sub-pin 502. Signal interference and short circuit caused by the first lead 801, the second lead 802, and the control signal line 70 crossing each other can be avoided.

In alternative embodiments, returning to FIG. 1 and FIG. 5, if the number of first electrode blocks 201 is J and the number of first sub-pins 501 is K, then K≤J, where K and J are integers greater than 0. If the number of second electrode blocks 202 is M and the number of second sub-pins 502 is N, then 4≤N≤M, where M and N are integers greater than 4.

Further, when the drain of at least one first switch transistor 401 is electrically connected to the same first sub-pin 501 through the same first lead 801, and the drain of at least one second switch transistor 402 is electrically connected to the same second sub-pin 502 through the same second lead 802, that is, when each first sub-pin 501 is electrically connected to the first electrode block 201 through the first lead 801 and a first switch transistor 401, and each second sub-pin 502 is electrically connected to the second electrode block 202 through the second lead 802 and a second switch transistor 402, the number of the first sub-pins 501 is the same as the number of the first electrode blocks 201, and the number of the second sub-pins 502 is the same as the number of the second electrode blocks 202. When the drains of at least two first switch transistors 401 are electrically connected to the same first sub-pin 501 through the same first lead 801, and the drains of at least two second switch transistors 402 are electrically connected to the same second sub-pin 502 through the same second lead 802, that is, when each first sub-pin 501 is electrically connected to the at least two first electrode blocks 201 through the first lead 801 and the first switch transistor 401, and each second sub-pin 502 is electrically connected to the at least two second electrode blocks 202 through the second lead 802 and the second switch transistor 402, the number of the first sub-pins 501 is less than the number of the first electrode blocks 201, and the number of the second sub-pins 502 is less than the number of the second electrode blocks 202. Since the sensing signals of the second electrode blocks 202 in the same row or the same column may be the same along the first direction X and the second direction Y, but the sensing signals of the second electrode blocks 202 in different rows and different columns should be different to detect at least four different touch positions of up, down, left, and right, all of the second electrode blocks 202 cannot be connected to the same first sub-pin 501, and the number of second sub-pins 502 should be at least greater than or equal to 4, thereby detecting at least four different touch position signals when the touch floating is performed.

Figure 7:
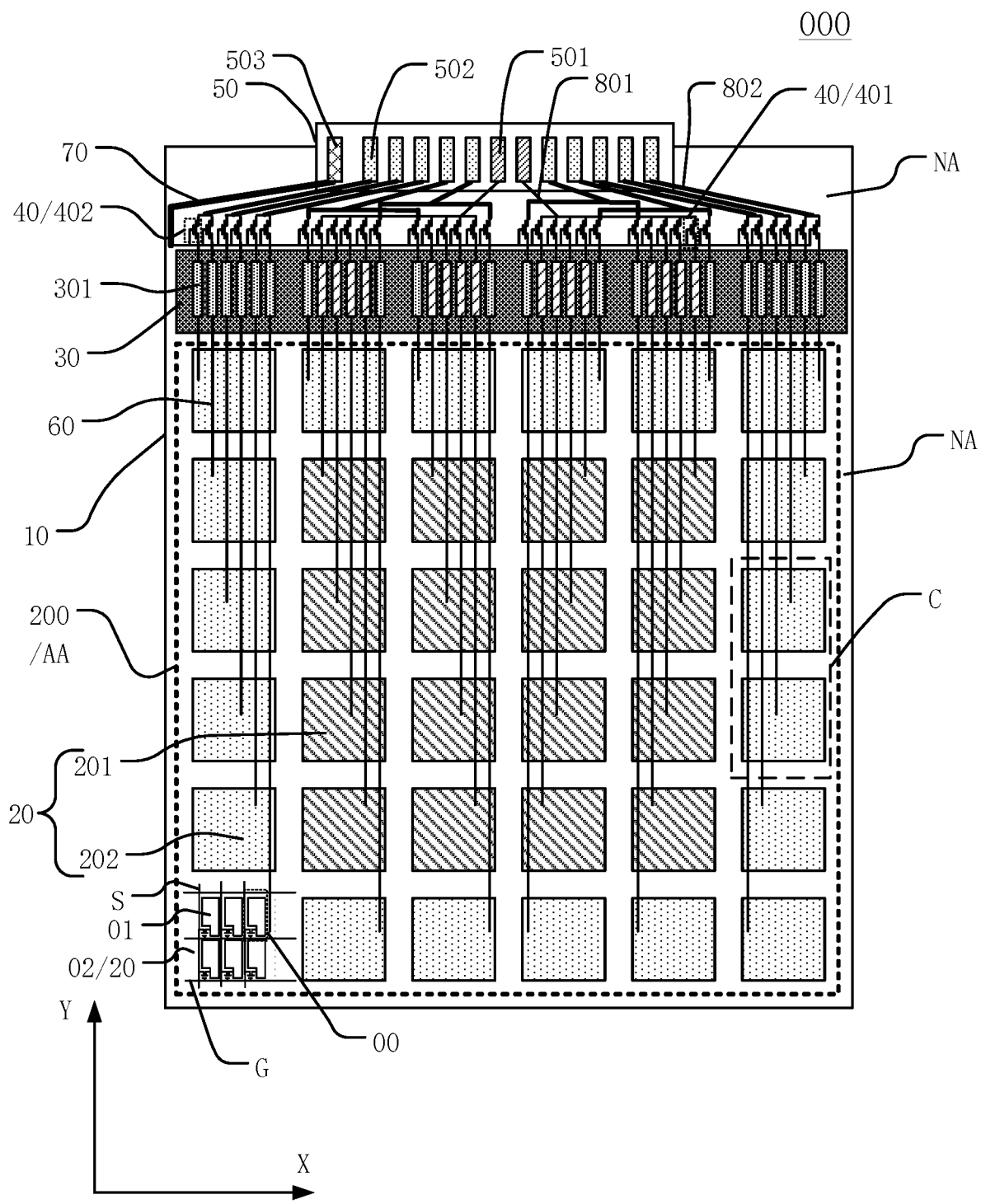
FIG. 7 illustrates a plan view of another touch display panel according to an embodiment of the present disclosure.
Figure 8:
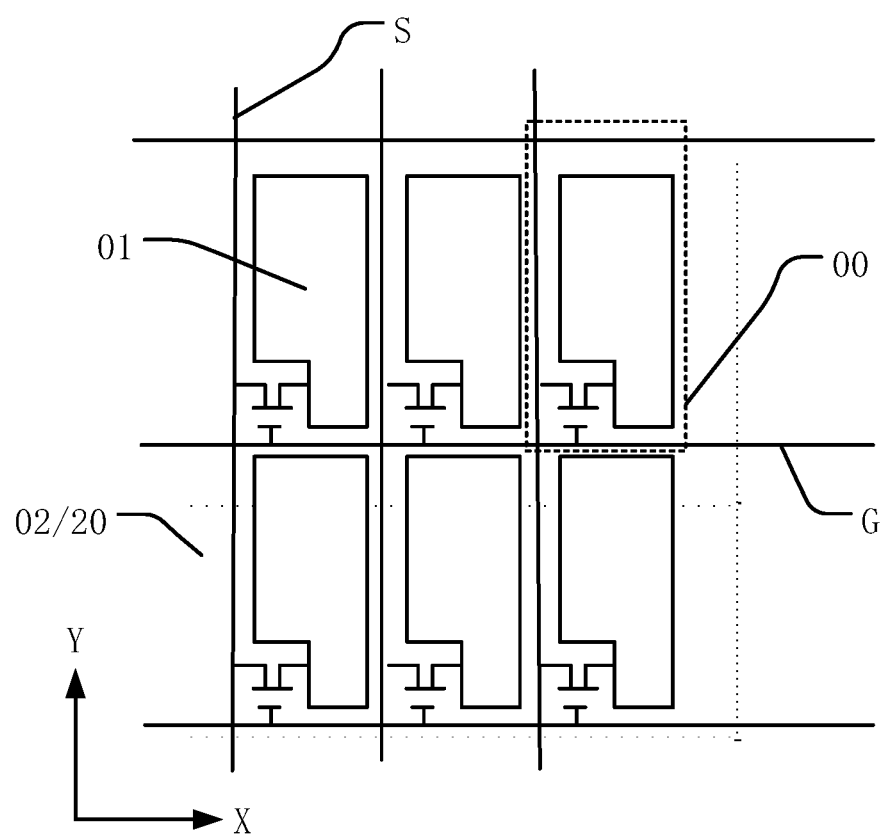
FIG. 8 illustrates a partial, enlarged perspective view of location of an electrode strip in FIG. 7.

FIG. 7 illustrates a plan view of another touch display panel according to an embodiment of the present disclosure (In FIG. 7, the number of electrode blocks and the number of pins on a driving unit are only examples and can be set based on actual situations. To illustrate technical solution of the present embodiment more clearly, FIG. 7 shows only a sub-pixel 00 of the position of an electrode block 20). FIG. 8 illustrates a partial, enlarged perspective view of location of an electrode strip in FIG. 7. In one embodiment, the touch display panel 000 further includes a plurality of scan lines G extending along the first direction X, a plurality of data lines S extending along the second direction Y, and a plurality of sub-pixels 00. The scan lines G and the data lines S are cross insulated to define an area where the sub-pixels 00 are located. The first direction X and the second direction Y intersect; the first driving unit 30 is electrically connected to the scan lines G and the data lines S (The electrical connection leads are not illustrated in FIG. 7 and FIG. 8); and an orthographic projection of each electrode block 20 to the base substrate 10 covers an orthographic projection of the plurality of sub-pixels 00 to the base substrate 10. Each of the sub-pixels 00 includes at least a pixel electrode 01 and a common electrode 02, and the electrode block 20 is operable as the common electrode 02.

Further, the touch display panel 000 includes a plurality of scan lines G extending along the first direction X, a plurality of data lines S extending along the second direction Y, a plurality of sub-pixels 00. The scan lines G and data lines S are cross insulated to define the area where the sub-pixels 00 are located. When the display function, the floating touch function and the planar touch function are performed in a time division manner under the timing control, the electrode block 20 can be operable as the common electrode 02 for display in the display phase, and the first driving unit 30 is electrically connected to the scan lines G and the data lines S. The first driving unit 30 is operable as applying a display driving signal, realizing the display function of the panel. Therefore, manufacturing cost can be saved, and the touch display panel integrated with the display function, the planar touch function and the floating touch function can be obtained.

In alternative embodiments, as shown in FIG. 7, the touch display panel 000 includes a display area AA and a non-display area NA disposed around the display area AA. The first driving unit 30, the second driving unit 50, and the switch transistor 40 are located in the non-display area NA range, and the electrode block 20 is located in the display area AA range. The switch transistor 40 is located at a side of the first driving unit 30 facing away from the display area AA, and the second driving unit 50 is located at a side of the switch transistor 40 facing away from the display area AA.

This embodiment further explains the locations of the first driving unit 30, the second driving unit 50, the switch transistor 40, and the electrode block 20 on the touch display panel 000. The first driving unit 30, the second driving unit 50, and the switch transistors 40 are all disposed in the non-display area NA range, thereby not affecting the normal display function and touch function of the display area AA. The switch transistor 40 is located at a side of the first driving unit 30 facing away from the display area AA, and the second driving unit 50 is located at a side of the switch transistor 40 facing away from the display area AA. That is, all the switch transistors 40 are located between the first driving unit 30 and the second the driving unit 50, so that the two driving units may be electrically connected to each other through the source and drain of the switch transistor 40. The planar touch function and the floating touch function can be switched in a time division manner through controlling on and off status of the switch transistor 40.

In alternative embodiments, as shown in FIG. 7, the first driving unit 30 is a driver chip, and an orthographic projection of the driver chip to the base substrate 10 is all located on the base substrate 10. The second driving unit 50 is a flexible circuit board, and a portion of an orthographic projection of the flexible circuit board to the base substrate 10 is located on the base substrate 10.

Further, both the first driving unit 30 and the second driving unit 50 may be a driving circuit set on the base substrate 10, where the first driving unit 30 is integrated on the driving integrated circuit (IC), and the second driving unit 50 is integrated on the flexible circuit board. Alternatively, the flexible circuit board is a printing circuit board that is made of polyimide or polyester film and has high reliability and excellent flexibility. The flexible circuit board is referred to as a flexible board or flexible printed circuit board (referred to as FPC). It has the characteristics of high wiring density, light weight, and thin thickness. The second driving unit 50 is located at a side of the switch transistor 40 facing away from the display area AA. Therefore, it is set that the orthographic projection of the driver chip to the base substrate 10 is all located on the base substrate 10, and the orthographic projection of the flexible circuit board to the base substrate 10 is partly located on the base substrate 10. The portion of the orthographic projection of the flexible circuit board to the base substrate 10 that is not located on the base substrate 10 is folded to the back surface of the base substrate 10 along an edge of the base substrate 10. Thus, the flexible circuit board can only occupy a portion space of the non-display area NA, facilitating the realization of a narrow frame touch display panel.

Optionally, referring to FIG. 1 to FIG. 8, in one embodiment, an operating method of a touch display panel is further provided. The touch display panel is any one of touch display panels described in the above embodiments. The operating method of the touch display panel includes a first touch phase and a second touch phase.

In the first touch phase, the switch transistor 40 is in an off state, and the first driving unit 30 applies a driving signal to each electrode block 20 through the touch signal line 60. When the touch occurs, the first driving unit 30 determines the position where the touch occurs by receiving the difference of the sensing signals outputted by each electrode blocks 20.

In the second touch phase, the switch transistor 40 is in an on state, and the first driving unit 30 stops applying the driving signal to each electrode block 20. The second driving unit 50 applies the driving signal to each of the first electrode blocks 201 through the first sub-pin 501. The second driving unit 50 applies the sensing signal to each of the second electrode blocks 202 through the second sub-pin 502. An electric field is formed between the first electrode block 201 and the second electrode block 202. When the touch distance is less than or equal to the first distance, the touch occurs. The electric field between the first electrode block 201 and the second electrode block 202 changes, and the second driving unit 50 detects the change amount of capacitance value between the first electrode block 201 and the second electrode block 202 to determine the position where the touch occurs. The touch distance refers to a vertical distance between the touch body and the touch display panel, and the first distance is a preset value.

In one embodiment, the common electrode for performing the display function of the touch display panel 000 is operable as a sensing electrode for performing the planar touch function. The common electrode for performing the display function of the touch display panel 000 is also operable as a driving electrode and a sensing electrode for performing the floating touch function. The switch transistor 40 is disposed between the first driving unit 30 and the second driving unit 50. In conjunction with timing control, a switch operation among the planar touch, the floating touch function and the display function can be realized through turning on or turning off the switch transistor 40. When the switch transistor 40 is turned off, the planar touch function and the display function can be performed. When the switch transistor 40 is turned on, the floating touch function can be performed. For example, the floating touch function and the planar touch function are performed in a time division manner, and the floating touch function and the planar touch function are switched by the timing and signal amount. When the vertical distance between the touch body and the touch display panel 000 is far, the planar touch signal is relatively weak. All the switch transistors 40 are turned on to enable the floating touch function. When the touch body is close to the surface of the touch display panel 000, the planar touch signal is enhanced. All the switch transistors 40 are turned off to disable the floating touch function and enable the planar touch function. Therefore, the integration of the planar touch function, the floating touch function and the display function is realized without the need to add additional peripheral sensing electrodes in the floating touch phase, facilitating the realization of the narrow frame. At the same time, the cost can be saved, and the touch sensing signal amount and touch accuracy can also be improved.

In alternative embodiments, referring to FIGS. 1-8, a range of the first distance is 15-20 cm.

Further, the touch occurs when the touch distance is less than or equal to the first distance. The first distance is a preset value according to product performance. In general, the first distance is 15-20 cm. That is, when the vertical distance between the touch body and the touch display panel is 15-20 cm, the floating touch function can be enabled. The second driving unit 50 detects the change amount of capacitance value between the first electrode block 201 and the second electrode block 202 to determine the position where the touch occurs. For floating touch method in the prior art, the strength of the electric field gradually decreases with the increase of the floating distance, and in general, the detection distance is only within 20 mm. When the detection distance is greater than 20 mm, the touch body cannot be detected, and the touch experience is poor. The touch display panel and the operating method thereof solve the problem that the floating touch function is enabled when the distance between the finger and the screen is relatively close in the prior art, and the user experience can be improved.

In alternative embodiments, referring to FIG. 7-FIG. 8, the touch display panel 000 further includes a plurality of scan lines G extending in the first direction X, a plurality of data lines S extending in the second direction Y, a plurality of sub-pixels 00. The scan lines G and the data lines S are cross insulated to define an area where the sub-pixels 00 are located. The first direction X and the second direction Y are intersected.

The operating method further includes a display phase. In the display phase, the switch transistor 40 is in an off state, and the first driving unit 30 applies a common potential signal to each electrode block 20 through the touch signal line 60.

Further, the operating method of the touch display panel 000 further includes a display phase. The touch display panel 000 includes a plurality of scan lines G extending along the first direction X, a plurality of data lines extending along the second direction Y, and a plurality of sub-pixels 00. The scan lines G and the data lines S are cross insulated to define the area where the sub-pixels 00 are located. When the display function, the floating touch function, and the planar touch function are performed in a time division manner under the timing control, the electrode block 20 can be operable as the common electrode 02 for display in the display phase. The first driving unit 30 is electrically connected to the scan lines G and the data lines S. The first driving unit 30 is operable to apply a display driving signal, realizing the display function of the panel. Therefore, manufacturing cost is saved, and the touch display panel integrated with the display function, the planar touch function and the floating touch function can be obtained.

Figure 9:
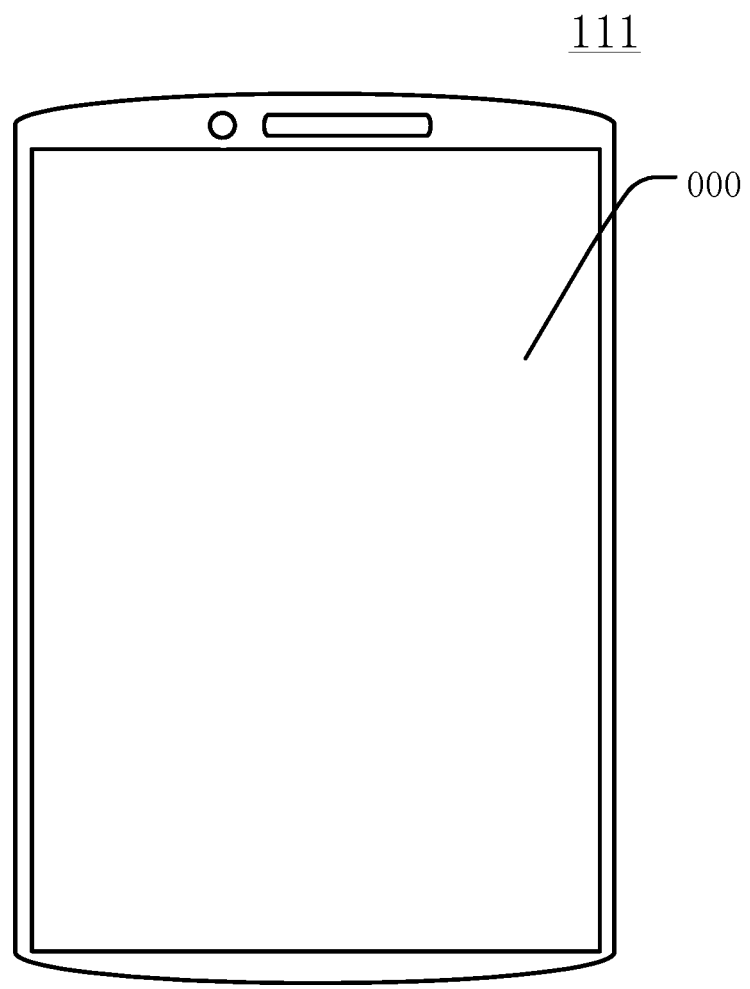
FIG. 9 illustrates a structural schematic of a touch display device according to an embodiment of the present disclosure.

In alternative embodiments, FIG. 9 illustrates a structural schematic of a touch display device according to an embodiment of the present disclosure. As shown in FIG. 9, a touch display device 111 includes a touch display panel 000 and the operating method described in the above embodiments, which can be used for a display function, a planar touch function, and a floating touch function. In FIG. 9, a touch display device 111 is described by using a cellular phone as an example. It should be understood that according to an embodiment of the present disclosure, a touch display device 111 may be a computer, a television, a car display device, a digital photo frame, a navigator, and any other product or component having a display function and a touch function, which is not limited in herein. The touch display device 111 has the beneficial effects of the touch display panel 000 provided by the embodiments of the present disclosure. The details of the beneficial effects of the touch display panel 000 refers to the specific description of the touch display panel 000 in the above embodiments, which are not repeated herein.

It can be seen from the above embodiments that the touch display panel, the operating method thereof and the touch display device provided by the present disclosure achieve at least the following beneficial effects.

The common electrode for performing the display function of the touch display panel is operable as a sensing electrode for performing the planar touch function. The common electrode for performing the display function of the touch display panel is also operable as a driving electrode and a sensing electrode for performing the floating touch function. The switch transistor is disposed between the first driving unit and the second driving unit. In conjunction with timing control, a switch operation among the planar touch function, the floating touch function, and the display function can be realized through turning on or turning off the switch transistor. When the switch transistor is turned off, the planar touch function and the display function can be performed. When the switch transistor is turned on, the floating touch function can be performed. For example, the floating touch function and the planar touch function are performed in a time division manner, and the floating touch function and the planar touch function are switched by the timing and signal amount. When the vertical distance between the touch body and the touch display panel is far, the planar touch signal is relatively weak. All the switch transistors are turned on to enable the floating touch function. When the touch body is close to the surface of the touch display panel, the planar touch signal is enhanced. All the switch transistors are turned off to disable the floating touch function and enable the planar touch function. Therefore, the integration of the planar touch function, the floating touch function and the display function can be realized without the need to add additional peripheral sensing electrode in the floating touch phase, facilitating the realization of the narrow frame. At the same time, the cost can be saved, and the touch sensing signal amount and touch accuracy can be improved.

While certain embodiments of the present disclosure have been described, it is understood that a person of ordinary skill in the art can modify or change the embodiments after knowing the basic inventive concept. Therefore, the appended claims are intended to be interpreted as including the disclosed embodiments and the modifications and changes falling within the scope of the present disclosure.

It is apparent that those skilled in the art can make various modifications and variations to the disclosure without departing from the spirit and scope of the disclosure. Thus, it is intended that the present disclosure cover the modifications and variations of the disclosure.

What is claimed is:

1. A touch display panel, comprising:
a base substrate, a plurality of electrode blocks arranged in an array on the base substrate; a first driving unit including a plurality of first pins; a plurality of switch transistors; and a second driving unit including at least a plurality of first sub-pins and a plurality of second sub-pins, wherein:
each of the plurality of electrode blocks is electrically connected to the first driving unit through at least one touch signal line;
one end of each touch signal line is electrically connected to one electrode block, and the other end of each touch signal line is electrically connected to the first pin in one-to-one correspondence;
a source of each switch transistor is electrically connected to the first pin in one-to-one correspondence, and a drain of each switch transistor is electrically connected to the first sub-pin or the second sub-pin;
a gate of each switch transistor is electrically connected to a same control signal line, and the control signal line is electrically connected to the second driving unit;
the plurality of electrode blocks arranged in the array include at least one electrode block group, wherein each electrode block group includes a plurality of first electrode blocks and a plurality of second electrode blocks disposed around the plurality of first electrode blocks;
the plurality of switch transistors include a plurality of first switch transistors and a plurality of second switch transistors, wherein the switch transistor electrically connected to the first electrode block is the first switch transistor, and the switch transistor electrically connected to the second electrode block is the second switch transistor;
the drain of at least one first switch transistor is electrically connected to the same first sub-pin through a same first lead; and
the drain of at least one second switch transistor is electrically connected to the same second sub-pin through a same second lead.

2. The touch display panel according to claim 1, wherein:
the base substrate includes a bonding area, wherein the bonding area includes a plurality of first conductive pads and a plurality of second conductive pads; the first pins are electrically connected to the first conductive pads in one-to-one correspondence; and the first sub-pins and the second sub-pins are electrically connected to the second conductive pads in one-to-one correspondence.

3. The touch display panel according to claim 1, wherein:
the second driving unit further includes at least one third sub-pin, and the gate of the switch transistor is electrically connected to the third sub-pin through the control signal line.

4. The touch display panel according to claim 3, wherein:
in a same direction, the third sub-pin is located at one end of the second driving unit, and the plurality of second sub-pins include two portions that are respectively located at opposite ends of the plurality of first sub-pins.

5. The touch display panel according to claim 1, wherein:
when the number of first electrode blocks is J and the number of first sub-pins is K, K≤J, wherein K and J are integers greater than 0; and
when the number of second electrode blocks is M and the number of second sub-pins is N, 4≤N≤M, wherein M and N are integers greater than 4.

6. The touch display panel according to claim 1, wherein:
the drains of at least two first switch transistors are electrically connected to the same first sub-pin through the same first lead; and
the drains of at least two second switch transistors are electrically connected to the same second sub-pin through the same second lead.

7. The touch display panel according to claim 1, wherein:
the touch display panel further includes a plurality of scan lines extending along a first direction, a plurality of data lines extending along a second direction, and a plurality of sub-pixels, wherein:
the scan lines and the data lines are cross insulated to define an area where the sub-pixels are located;
the first direction and the second direction intersect; and the first driving unit is electrically connected to the scan lines and the data lines; and an orthographic projection of each electrode block to the base substrate covers an orthographic projection of the plurality of sub-pixels to the base substrate.

8. The touch display panel according to claim 7, wherein:
each of the sub-pixels includes at least a pixel electrode and a common electrode, and the electrode block is operable as the common electrode.

9. The touch display panel according to claim 1, wherein:
the touch display panel includes a display area and a non-display area disposed around the display area, wherein the first driving unit, the second driving unit, and the switch transistor are located in the non-display area range, and the electrode block is located in the display area range; and
the switch transistor is located at a side of the first driving unit facing away from the display area, and the second driving unit is located at a side of the switch transistor facing away from the display area.

10. The touch display panel according to claim 1, wherein:
the first driving unit is a driver chip, and an orthographic projection of the driver chip to the base substrate is all located on the base substrate; and
the second driving unit is a flexible circuit board, and a portion of an orthographic projection of the flexible circuit board to the base substrate is located on the base substrate.

11. An operating method of a touch display panel, the touch display panel including a base substrate, a plurality of electrode blocks arranged in an array on the base substrate, a first driving unit including a plurality of first pins, a plurality of switch transistors, and a second driving unit including at least a plurality of first sub-pins and a plurality of second sub-pins, wherein each electrode block is electrically connected to the first driving unit through at least one touch signal line; a drain of at least one first switch transistor is electrically connected to a same first sub-pin through a same first lead; and a drain of at least one second switch transistor is electrically connected to the same second sub-pin through a same second lead, the method comprising:
a first touch phase, wherein:
a switch transistor is in an off state;
a first driving unit applies a driving signal to each electrode block through a touch signal line; and
when a touch occurs, the first driving unit determines a position where the touch occurs by receiving difference of sensing signals outputted by each electrode block; and
a second touch phase, wherein:
the switch transistor is in an on state;
the first driving unit stops applying the driving signal to each electrode block;
the second driving unit applies the driving signal to each first electrode block through a first sub-pin;
the second driving unit applies the sensing signal to each second electrode block through a second sub-pin;
an electric field is formed between the first electrode block and the second electrode block;
when a touch distance is less than or equal to a first distance, the touch occurs;
the electric field between the first electrode block and the second electrode block changes; and
the second driving unit detects a change amount of capacitance value between the first electrode block and the second electrode block to determine the position where the touch occurs, wherein the touch distance refers to a vertical distance between a touch body and the touch display panel.

12. The method according to claim 11, wherein:
a range of the first distance is between 15 cm and 20 cm.

13. The method according to claim 11, wherein:
the touch display panel further includes a plurality of scan lines extending along a first direction, a plurality of data lines extending along a second direction, and a plurality of sub-pixels, wherein:
the scan lines and the data lines are cross insulated to define an area where the sub-pixels are located;
the first direction and the second direction intersect; and
the first driving unit is electrically connected to the scan lines and the data lines.

14. The method according to claim 11, further comprising a display phase, wherein:
in the display phase, the switch transistor is in an off state, and the first driving unit applies a common potential signal to each electrode block through the touch signal line.

15. A touch display device, comprising:
a touch display panel, comprising:
a base substrate, a plurality of electrode blocks arranged in an array on the base substrate; a first driving unit including a plurality of first pins; a plurality of switch transistors; and a second driving unit including at least a plurality of first sub-pins and a plurality of second sub-pins,
wherein:
each of the plurality of electrode blocks is electrically connected to the first driving unit through at least one touch signal line;
one end of each touch signal line is electrically connected to one electrode block, and the other end of each touch signal line is electrically connected to the first pin in one-to-one correspondence;
a source of each switch transistor is electrically connected to the first pin in one-to-one correspondence, and a drain of each switch transistor is electrically connected to the first sub-pin or the second sub-pin;
a gate of each switch transistor is electrically connected to a same control signal line, and the control signal line is electrically connected to the second driving unit;
the plurality of electrode blocks arranged in the array include at least one electrode block group, wherein each electrode block group includes a plurality of first electrode blocks and a plurality of second electrode blocks disposed around the plurality of first electrode blocks;
the plurality of switch transistors include a plurality of first switch transistors and a plurality of second switch transistors, wherein the switch transistor electrically connected to the first electrode block is the first switch transistor, and the switch transistor electrically connected to the second electrode block is the second switch transistor;
the drain of at least one first switch transistor is electrically connected to the same first sub-pin through a same first lead; and the drain of at least one second switch transistor is electrically connected to the same second sub-pin through a same second lead.

\* \* \* \* \*